(12) United States Patent
Hwu et al.

(10) Patent No.: US 6,501,363 B1
(45) Date of Patent: Dec. 31, 2002

(54) VERTICAL TRANSFORMER

(75) Inventors: Ruey-Jen Hwu, Salt Lake City, UT (US); Jishi Ren, Calgary (CA)

(73) Assignee: InnoSys, Inc., Salt Lake City, UT (US)

( * ) Notice: Subject to any disclaimer, the term of this patent is extended or adjusted under 35 U.S.C. 154(b) by 54 days.

(21) Appl. No.: 09/706,328

(22) Filed: Nov. 3, 2000

Related U.S. Application Data

(60) Provisional application No. 60/163,294, filed on Nov. 3, 1999.

(51) Int. Cl.[7] .................................. H01F 5/00
(52) U.S. Cl. ................... 336/200; 336/232; 336/223; 29/602.1
(58) Field of Search ................... 336/200, 223, 336/232; 29/602.1

(56) References Cited

U.S. PATENT DOCUMENTS

| | | | |
|---|---|---|---|
| 4,253,231 A | | 3/1981 | Nouet |
| 4,598,276 A | * | 7/1986 | Tait ............................ 340/572 |
| 5,095,357 A | * | 3/1992 | Andoh et al. ............... 257/379 |
| 5,202,752 A | | 4/1993 | Honjo |
| 5,386,206 A | | 1/1995 | Iwatani et al. |
| 5,402,098 A | | 3/1995 | Ohta et al. |
| 5,515,022 A | | 5/1996 | Tashiro et al. |
| 5,566,083 A | | 10/1996 | Fang |
| 5,949,299 A | | 9/1999 | Harada |
| 5,973,653 A | | 10/1999 | Kragalott et al. |
| 6,054,914 A | * | 4/2000 | Abel et al. .................. 336/200 |
| 6,064,810 A | | 5/2000 | Raad et al. |
| 6,198,374 B1 | * | 3/2001 | Abel .......................... 336/200 |

OTHER PUBLICATIONS

Engels, M., and R.H. Jansen, "Modeling and Design of Novel Passive MMIC Components with Three and More Conductor Levels," *IEEE MTT–S Digest*, pp. 1293–1296, May 1994.

Koh, D., and T. Itoh, "A Hybrid Full–Wave Analysis of Via–Hole Grounds Using Finite–Difference and Finite–Element Time Domain Methods," *IEEE Trans. MTT*, vol. 45, No. 12, pp. 2217–2222, Dec. 1997.

Piket–May, M., et al., "FD–TD Modeling of Digital Signal Propagation in 3–D Circuits With Passive and Active Loads," *IEEE Trans. MTT*, vol. 42, pp. 1514–1523, Aug. 1994.

Zhou, J.J., and D.J. Allstot, "Monolithic Transformers and Their Application in a Differential CMOS RF Low–Noise Amplifier," *IEEE Journal of Solid–State Circuits*, vol. 33, No. 12, 2020–2027, Dec. 1998.

* cited by examiner

*Primary Examiner*—Anh T. Mai
(74) *Attorney, Agent, or Firm*—Christensen O'Connor Johnson Kindness PLLC

(57) ABSTRACT

A vertical transformer that comprises a primary and a secondary winding, wherein one winding is positioned on a first plane, and the other winding is positioned on a second plane. The primary and secondary windings are separated by a dielectric substrate. In one embodiment, the primary and secondary windings are configured to use the same ground reference, and terminals in the center of each winding are connected to the ground reference by a via hole to form an in-phase transformer. In a second embodiment, a center terminal of one winding and an outbound terminal of the other winding are connected to the ground reference to form an opposite-phase transformer. In the second embodiment, a dielectric substrate is positioned between one of the windings and a ground plane.

15 Claims, 14 Drawing Sheets

OPPOSITE-PHASE VERTICAL STRUCTURE

VERTICAL TRANSFORMER

CROSS-REFERENCE TO RELATED APPLICATION

This nonprovisional application claims the benefit under 35 U.S.C. §119(e) of U.S. Provisional Application No. 60/163,294 filed on Nov. 3, 1999, and titled "3-D VERTICAL MMIC STRUCTURES AND SOFTWARE FOR CAPACITORS, TRANSFORMERS, RESONATORS AND OTHER COMPONENTS," the subject matter of which is specifically incorporated herein by reference.

FIELD OF THE INVENTION

The present invention relates to the integrated circuits, and in particular, to transformers and a system and method for analyzing the same.

BACKGROUND OF THE INVENTION

Transformers are widely used in electrical and electronic engineering for the purpose of voltage, signal or impedance transformation. In high frequency integrated circuits or microwave monolithic integrated circuits (MMICs), transformers are usually used in low-noise amplifiers (LNA), doubly-balanced mixers, or voltage-controlled oscillators (VCO). More particularly, coplanar microstrip, stripline couplers, or coplanar transformers are commonly used in applications where signals need to be coupled at different voltage or phase levels or the impedance of a terminator needs to be transformed to another level. Typical designs for such applications involve transformers having primary and secondary windings that are configured on the same plane. Although operable, these typical designs of coplanar transformers are found to occupy a large area of a chip on which they are fabricated, thus, leading to an inefficient manufacturing process.

SUMMARY OF THE INVENTION

The present invention provides a vertical transformer that comprises a primary and a secondary winding, wherein one winding is positioned on a first plane, and the other winding is positioned on a second plane. The primary and secondary windings are separated by a dielectric substrate. In one embodiment, the primary and secondary windings are configured to use the same ground reference, and terminals in the center of each winding are connected to the ground reference by a via hole to form an in-phase transformer. In a second embodiment, a center terminal of one winding and an outbound terminal of the other winding are connected to the ground reference to form an opposite-phase transformer. In the second embodiment, a dielectric substrate is positioned between one of the windings and a ground plane.

BRIEF DESCRIPTION OF THE INVENTION

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

One aspect of the present invention relates to a transformer for performing impedance or coupling transformation. More specifically, the present invention provides a vertical transformer that comprises a primary and a secondary winding, wherein one winding is positioned on a first plane, and the other winding is positioned on a second plane. The primary and secondary windings are separated by a dielectric or non-conducting substrate. In one embodiment, the primary, and secondary windings are configured to use the same ground reference, and terminals in the center of each winding are connected to the ground reference by a via hole to form an in-phase transformer. In a second embodiment, a center terminal of one winding and an outbound terminal of the other winding are connected to the ground reference to form an opposite-phase transformer. In addition, a dielectric substrate may be positioned between one of the windings and a ground plane.

In one embodiment of the present invention, the above-identified circuit may be constructed from an integrated circuit chip or a printed circuit board. In general, an integrated circuit chip, module substrates and printed circuit boards generally comprise a number of laminated layers. These layers are made up of conductive material that are, in turn, separated by insulating layers of appropriate thickness. The conductive layers or planes may be voltage supply planes or ground planes. External or interplanar connections are made to various planes of the multi-layered structure by via pins, also referred to as "via holes." Via holes are either electrically connected to a particular plane, or they may pass through a plane, being insulated therefrom by a hole therein, which is of sufficient diameter to provide the necessary electrical properties to electronically connect one plane to another.

Figure 1A:
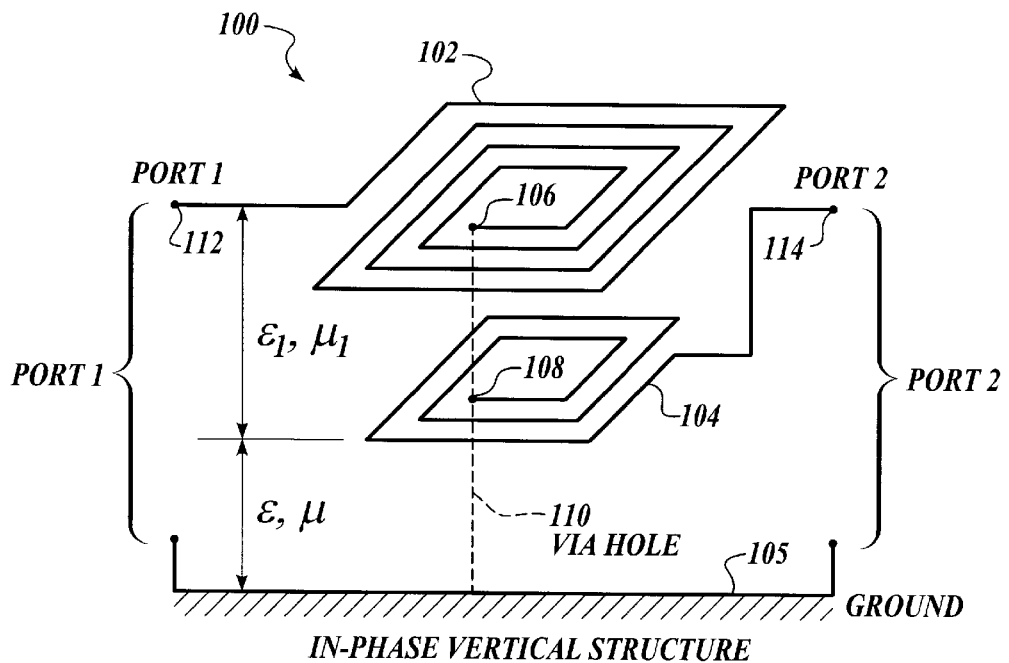
FIG. 1A is a perspective view showing an in-phase transformer in accordance with one embodiment of the present invention.

Referring now to FIG. 1A, one exemplary embodiment of an in-phase transformer 100 will now be described. The in-phase transformer 100 comprises a primary winding 102 positioned on a first plane, and a secondary winding 104 positioned on a second plane. The primary and secondary winding 102 and 104 are positioned such that the planes of each winding are substantially parallel to one another. In addition, the in-phase transformer 100 comprises a conductive surface 105 that forms a plane that is parallel to the planes of the primary and second windings 102 and 104. In this embodiment, the conductive surface 105 functions as a ground for the electrical connections associated with the in-phase transformer 100.

The windings 102 and 104 are formed into flat conductive strips each formed of rigid metal, preferably, such as copper or copper alloy. In one embodiment, the conductive strips have a rectangular cross section and can be formed with a thickness approximate to the range of 1–5 microns. The conductive strips have a multi-turn configuration in which a series of straight segments wind inwardly about an axis of the winding elements. The primary winding 102 winds inwardly in a clockwise direction from a terminal 112 at an outer edge of primary winding 102 to a center terminal 106. The secondary winding 102 winds in a clockwise direction inwardly from a terminal 114 at an outer edge of secondary winding 104 to a center terminal 108. The direction of each winding can be in a clockwise or counter-clockwise direction.

The primary and secondary windings 102 and 104 also comprise terminals in the center of each winding, 106 and 108, respectively. In the embodiment of FIG. 1A, the center terminals 106 and 108 are vertically aligned with one another such that a single via hole 110 can pass from the terminal 106 of the primary winding, through the terminal 108 of the secondary winding, to the conductive surface 105. The primary and secondary winding 102 and 104 also comprise terminals at the exterior ends of the windings, 112 and 114 respectively. Hence, a first port (port 1) is formed between the exterior terminal 112 of the primary winding 102 and the conductive surface 105, and a second port (port 2) is formed between the exterior terminal 114 of the secondary winding 104 and the conductive surface 105.

Figure 2A:
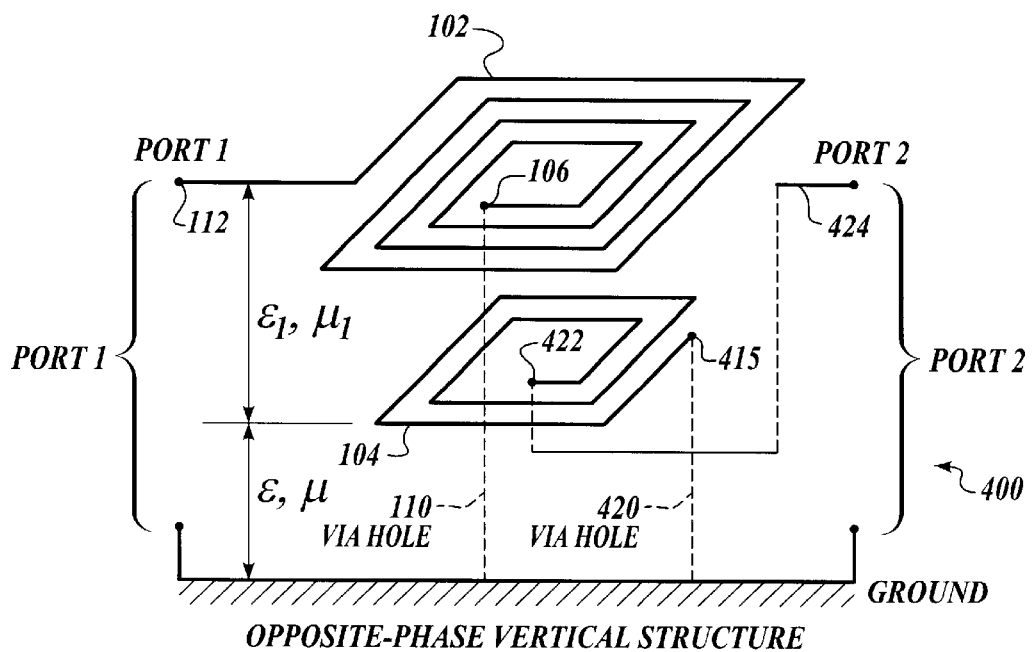
FIG. 2A is a perspective view showing an opposite-phase transformer in accordance with one embodiment of the present invention.

Referring now to FIG. 2A, one exemplary embodiment of an opposite-phase transformer 400 will now be described. The structure of the opposite-phase transformer 400 is similar to the structure of the in-phase transformer 100, except a second via hole 420 is configured to electronically connect an external terminal 415 of the secondary winding 104 to the conductive surface 105. Also unique to the opposite-phase transformer 400, a center terminal 422 of the secondary winding 104 is electronically connected to a terminal conductor 424 which, in conjunction with the conductive surface 105, forms a second port (port 2). The via hole 110 connected to the center terminal 106 of the primary winding 102 electronically couples the center terminal 106 to the conductive surface 105, however, in this embodiment, the via hole 110 is not electronically coupled to the secondary winding 104.

The opposite-phase transformer 400 comprises primary and secondary windings 102 and 104, and a dielectric substrate positioned between the windings. The windings 102 and 104 are formed into flat conductive strips each formed of rigid metal, preferably, such as copper or copper alloy. In one embodiment, the conductive strips have a rectangular cross section and can be formed with a thickness approximate to the range of 1–5 microns. The conductive strips have a multi-turn configuration in which a series of straight segments wind inwardly about an axis of the winding elements. The primary winding 102 winds inwardly in a clockwise direction from a terminal 112 at an outer edge of primary winding 102 to a center terminal 106. The secondary winding 102 winds in a clockwise direction inwardly from a terminal 415 at an outer edge of secondary winding 104 to a center terminal 422. The direction of each winding can be in a clockwise or counter-clockwise direction. The top winding is referred to the primary winding for illustrative purposes, as it is known in the art that either winding of a transformer can be interchangeably used as a primary or secondary winding.

The primary winding 102 is positioned on a first plane and the secondary winding 104 positioned on a second plane. The primary and secondary winding 102 and 104 are positioned such that the planes of each winding are substantially parallel to one another. In addition, the opposite-phase transformer 400 comprises a conductive surface 105 that forms a plane that is parallel to the plane of the primary and second windings 102 and 104.

The opposite-phase transformer 400 also comprises a conductive device, such as a via hole 110, to electronically couple the center terminal 106 to a conductive surface 105. A first port (port 1) is formed between the exterior terminal 112 of the primary winding 102 and the conductive surface 105. A center terminal 422 of the secondary winding is electronically coupled with a conductive device 424, which can be formed from a series of interconnections or a plurality of via holes. An exterior terminal 415 of the secondary winding 104 is coupled to the conductive surface 105 by a conductive device, such as a via hole 420. Accordingly, a second port (port 2) is formed between the conductive device 424 and the conductive surface 105.

Figure 3:
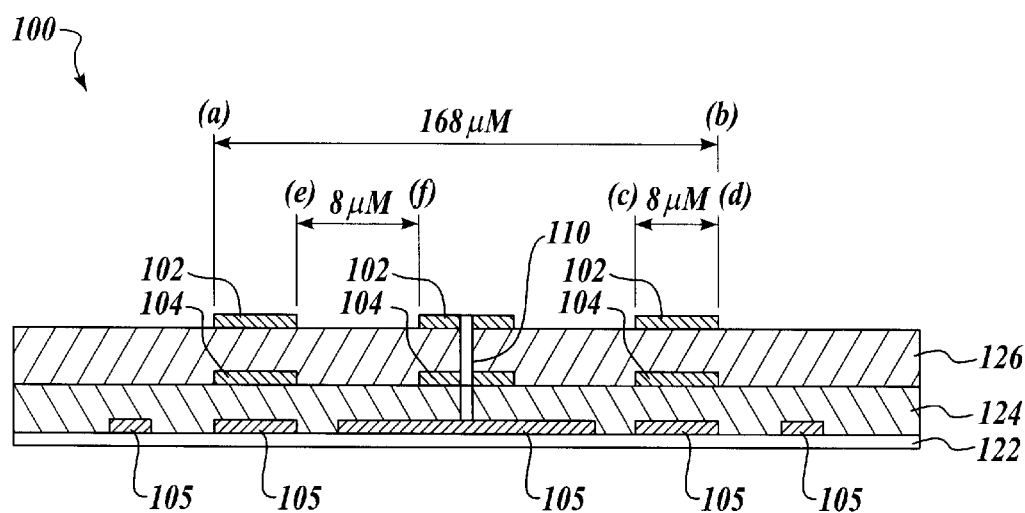
FIG. 3 is a sectional view of the transformer depicted in FIG. 1A illustrating each layer of the structure.

FIG. 3 is a sectional view of the in-phase transformer 100 illustrating each layer of the three-dimensional structure. Although the sectional view of FIG. 3 illustrates the embodiment of the in-phase transformer, the general structure and dimensions shown in this illustration also apply to the opposite-phase transformer 400. In one embodiment, the primary and secondary windings 102 and 104 can be configured to form a winding having an overall width of 168 micrometers, as indicated by points (a) and (b). The conductive strips of the primary and secondary windings 102 and 104 are formed from copper or any other conductive material. In this embodiment, the conductive strips have a width of 8.0 micrometers, as indicated by points (c) and (d), and the gap between each wind is also 8.0 micrometers, as indicated by points (e) and (f). Although these dimensions are described herein, the transformer design of the present invention can be made to conform to many other sizes depending on the application.

As shown in FIG. 3, the conductive strips of the primary and secondary windings 102 and 104 are positioned such that they are capable or receiving flux emissions from one another. In one embodiment, the conductive strips of the primary, winding 102 are positioned above or below the conductive strips of the secondary winding 104. The conductive strips of the primary winding 102 may be vertically aligned with the conductive strips of the secondary winding 104, or they may be positioned in a staggered configuration. In addition, for the in-phase transformer 100, the center terminals of the primary and secondary windings 102 and 104 are vertically aligned to allow a via hole 110 to contact the conductive strips of each winding 102 and 104. The via hole 110 is configured to such that it provides electrical communication between the primary winding 102, secondary winding 104 and the conductive surface 105. In this embodiment, the conductive surface 105 functions as the common ground node for the primary and secondary winding 102 and 104. Also shown, the dielectric material 124 is positioned between the primary and secondary windings 102 and 104 and can be formed from any substrate material with a dielectric characteristic. In one embodiment, the dielectric material 124 is formed from a material with a dielectric constant of three. One such suitable substrate for the dielectric material 124 is polyamides.

Figure 4:
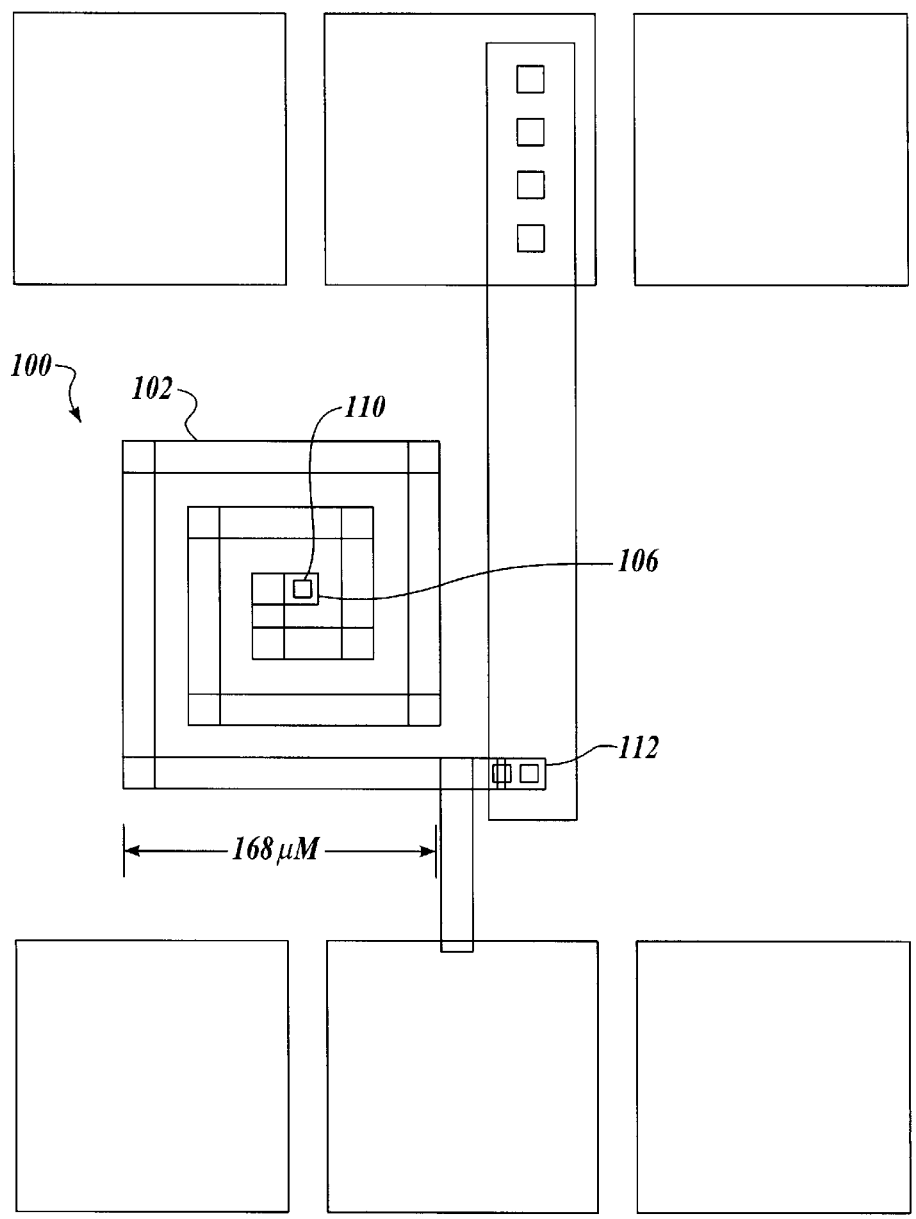
FIG. 4 is a top view of one plane of the transformer depicted in FIG. 1A.

FIG. 4 is a top view of one plane of a transformer in accordance with one aspect of the present invention. As shown in FIG. 4, the conductive strip of the winding 102 is configured in a spiral shape with a terminal 106 at the center of the winding and a terminal 112 at the exterior portion of the winding. The via hole 110 is positioned within the terminal 106 at the center of the winding allowing electrical communication with another winding positioned in another plane and/or the conductive surface 105. In the construction of the transformer 100, two layers having a shape similar to the conductive strip shown in FIG. 4 are formed. As described in more detail below, each layer of the transformer 100 is constructed by known fabrication methods.

In general, any type of substrate can be used as a foundation (item 122 of FIG. 3), such as gallium arsenide. The construction of the windings can be achieved by the use of a technique known as sputtering, which is a copper seed-layer deposition. Electrical plating techniques are used for a copper strip thickness of 5 to 20 microns. Once a dielectric layer, such as polyamides, is applied over the copper strip of the lower winding, the dielectric is dry-etched using oxygen plasma. The copper strip of the top winding is then applied using the sputtering or electrical plating techniques. Although these exemplary fabrication techniques are utilized, it is known to one skilled in the art that copper strips and dielectric layers can be applied using many other fabrication or circuit board construction techniques.

Returning to FIGS. 1A–2B, one method of modeling the transformers in the form of a circuit diagram will now be described. As known in the art, the length, width, number of turns of the windings, and the separation of the windings in a transformer can be adjusted based on the application requirements, such as a need for a specific center frequency, operation bandwidth, transformation ratio, or phase or impedance transformation. More specifically, the separation between the primary and secondary windings impacts the operating bandwidth of the transformer 100. When the windings are close together, the bandwidth is significantly increased. Thus, a tightly coupled transformer will have better performance for the impedance transformation in the frequency domain. In one exemplary embodiment of FIGS. 1A, 2A, and 3 the separation between the primary and secondary windings 102 and 104 is approximately six micrometers, and the separation between the secondary winding 104 and the conductive ground plane 105 is approximately thirty micrometers. As shown in the charts of FIGS. 5–9, these dimensions of the vertical transformer provide characteristics similar to a traditional lumped transformer.

Similarly, other adjustments can be made to configure a transformer. For example, the ratio of turns for the windings can be adjusted to improve the performance of the transformer if a decreased transformation ratio is needed. As known in the art, the range for the ratio of turns can be any value that is needed for the application. For instance, the ratio of turns can be two to one if such a coupling is desired. In addition, the length of the conductive strips in the windings can be adjusted to configure the transformer for various center frequencies.

Figure 1B:
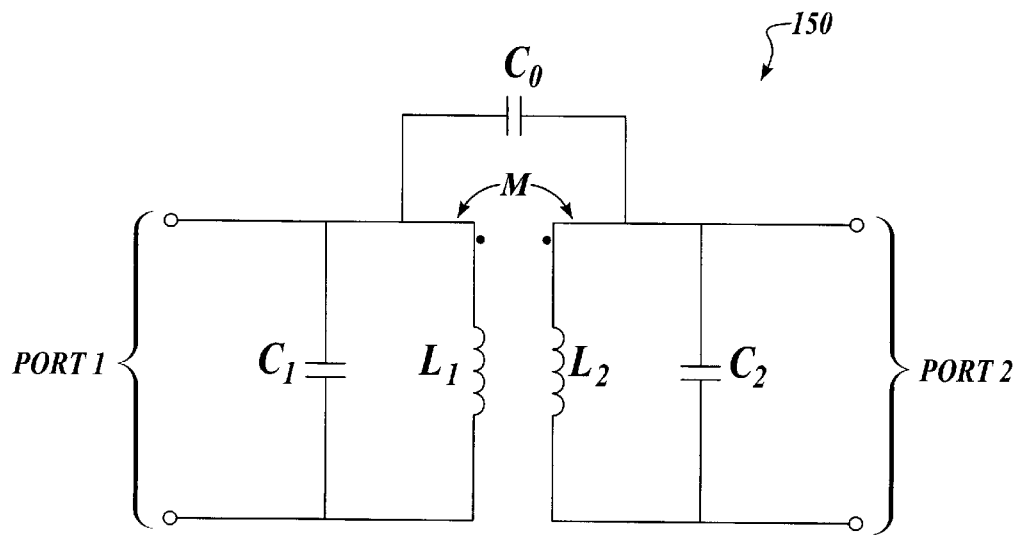
FIG. 1B is circuit diagram that may be used to model the in-phase transformer depicted in FIG. 1A.
Figure 2B:
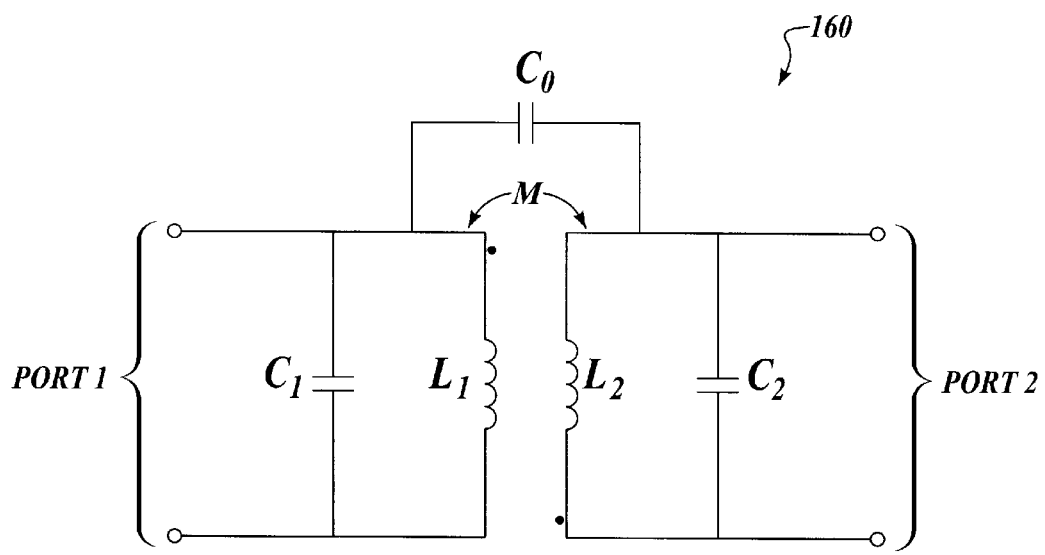
FIG. 2B is circuit diagram that may be used to model the opposite-phase transformer depicted in FIG. 2A.

FIGS. 1B and 2B illustrate circuit diagrams 150 and 160 that model the in-phase transformer 100 and the opposite-phase transformer 400, respectively. For illustrative purposes, the symbols for each electronic parameter are shown. All equivalent circuit parameters are the functions of the above-described structure parameters. For example, the mutual inductance M depends on the separation between upper and lower windings. Generally described, the smaller the separation, the larger the mutual inductance M. The inductance L1 and L2 depend on the length and permeability, $\mu$, of each winding. For instance, when the length of each winding increases, the inductance value increases. The capacitance C1 and C2 largely depend on the permittivity, $\epsilon$, and the distance from the plane, on which the winding is laid, to the reference ground. As known to one of ordinary skill in the art, the total combination of the equivalent circuit parameters determines the resonance frequency and bandwidth. In addition, the choice of large permeability, $\mu$, can significant improve the performance of lower frequency range. These circuit models 150 and 160 and the frequency response graphs shown in FIGS. 5–9 illustrate that the transformers 100 and 400 of the present invention have performance characteristics of a standard transformer.

FIGS. 5–9 illustrate the impedance graphs of the above-described transformers. The graph lines referenced with an "R" in each graph denotes the resistance, the real component of the impedance, and the graph lines referenced with an "X" in each graph denotes the reactance, the imaginary component of the impedance. The resistance ("R") line shown in each chart represents the resistance value when the imaginary component ("X") of the impedance is at a zero value.

Figure 5:
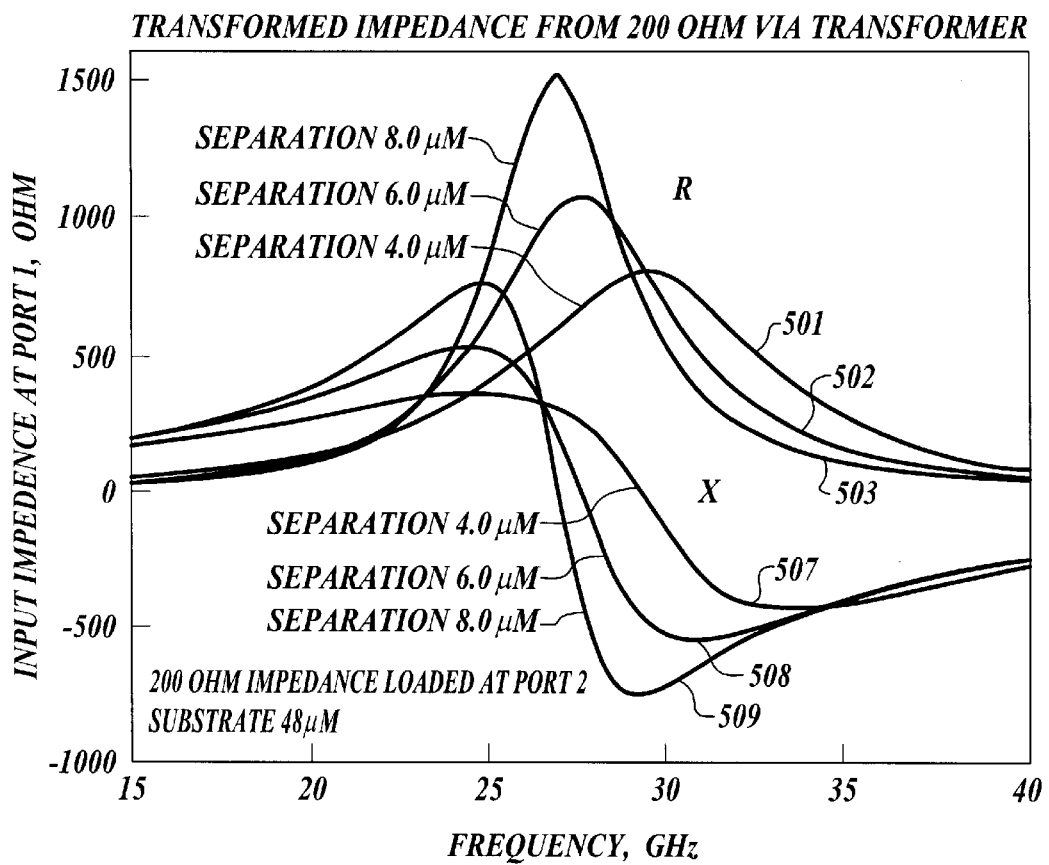
FIGS. 5–9 illustrate graphs of the transformed impedance of a transformer in accordance with one embodiment of the present invention.

With reference to FIG. 5, the graph illustrates the transformed impedance of a transformer in accordance with one embodiment having a 200 Ohm impedance load connected to port 2. As shown in FIG. 5, the input impedance of port 1 varies over a wide range of frequencies. Also shown, the graph of FIG. 5 illustrates two different sets of lines charting the transformed impedance when the separation between the primary and secondary windings is 4 $\mu$m (lines 501 and 507), 6 $\mu$m (lines 502 and 508), and 8 $\mu$m (lines 503 and 508). As can be seen from the graph of FIG. 5, the 200 Ohm impedance load connected to port 2 is respectively transformed into 1500, 1000 and 800 Ohms for the 4, 6, and 8 micron separation. In addition, the input impedance of port 1 is more uniform, i.e., having a broader bandwidth, when the separation between the primary and secondary windings is smaller.

Figure 6:
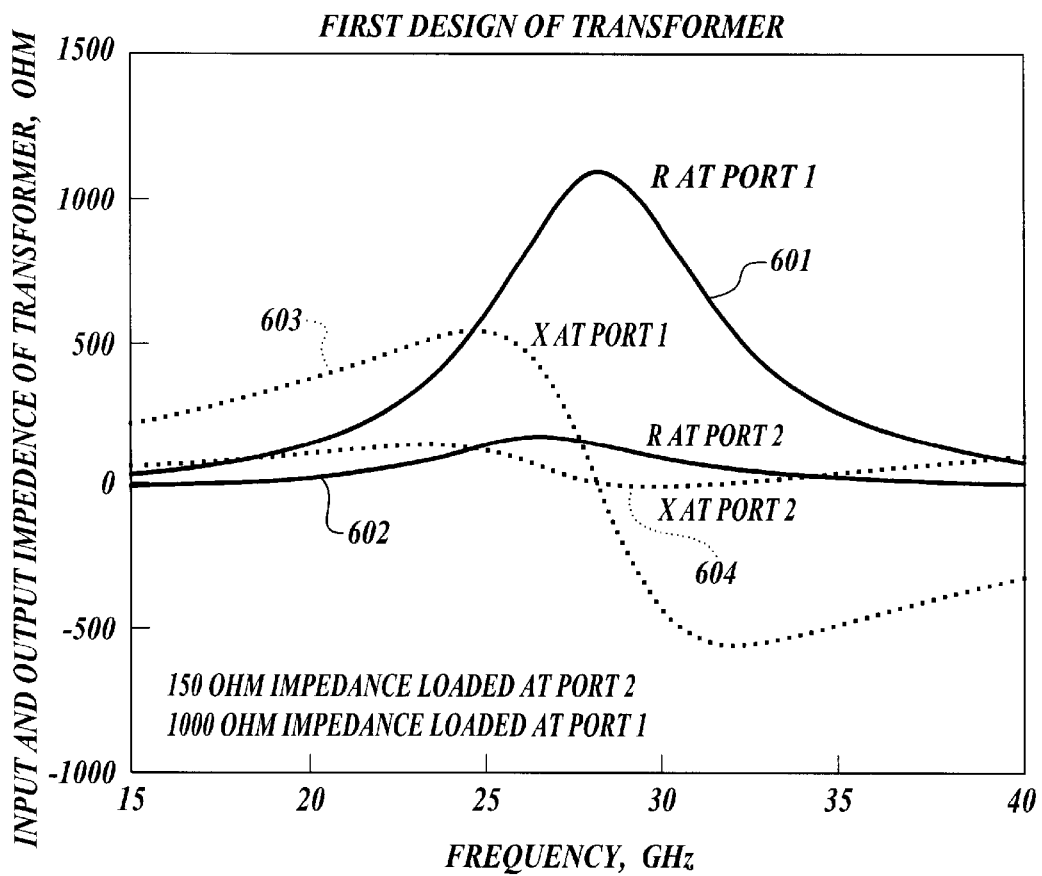

FIG. 6 illustrates a graph of the transformed impedance of a transformer in accordance with another embodiment of the present invention. The first line 601 graphs the resistance, the real component of the impedance, of port 1 when port 2 is loaded with an impedance of 150 Ohms. The second line 602 graphs the input resistance of port 2 when port 1 is loaded with an impedance of 1000 Ohms. The third and forth lines 603 and 604 respectively graph the input reactance, the imaginary component of the impedance, of port 1 and port 2.

Figure 7:
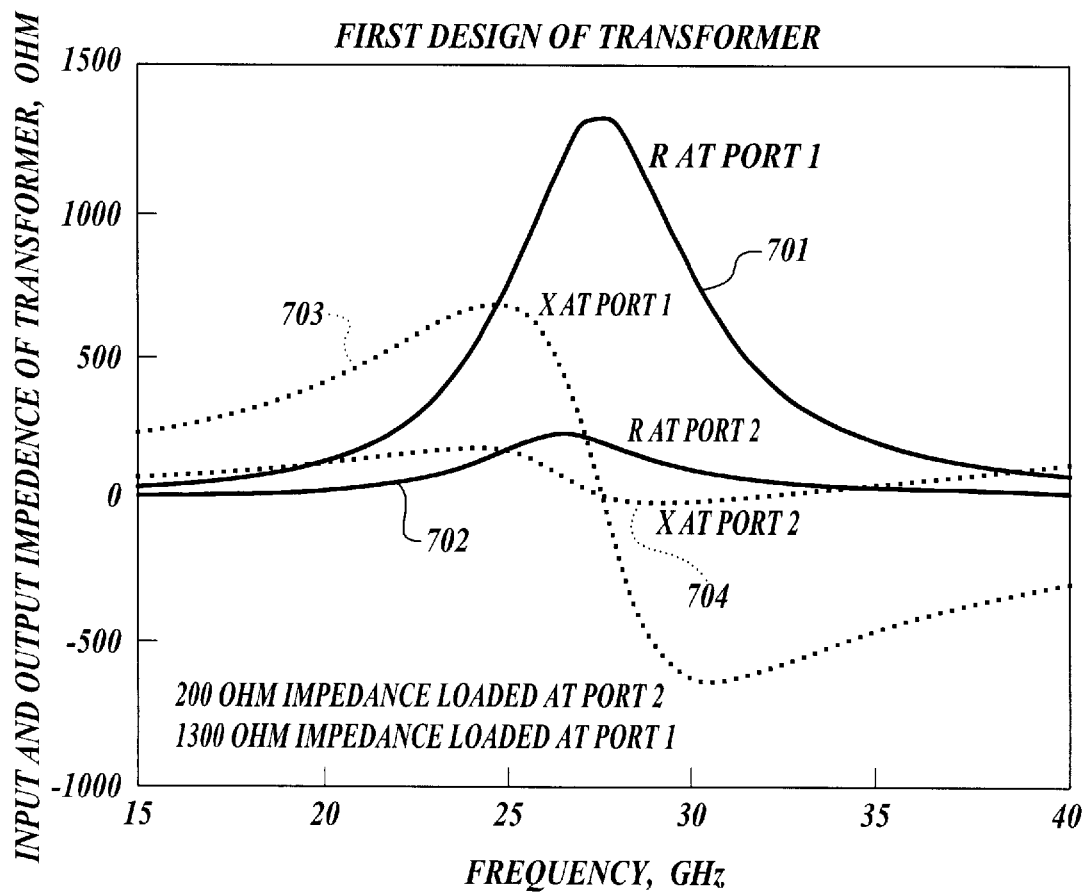

FIG. 7 illustrates a graph of the transformed impedance of a transformer in accordance with yet another embodiment of the present invention. The first line 701 graphs the resistance, the real component of the impedance, of the input impedance of port 1 when port 2 is loaded with an impedance of 200 Ohms. The second line 702 graphs the input resistance of port 2 when port 1 is loaded with an impedance of 1300 Ohms. The third and forth lines 703 and 704 respectively graph the input reactance, the imaginary component of the impedance, of port 1 and port 2.

Figure 8:
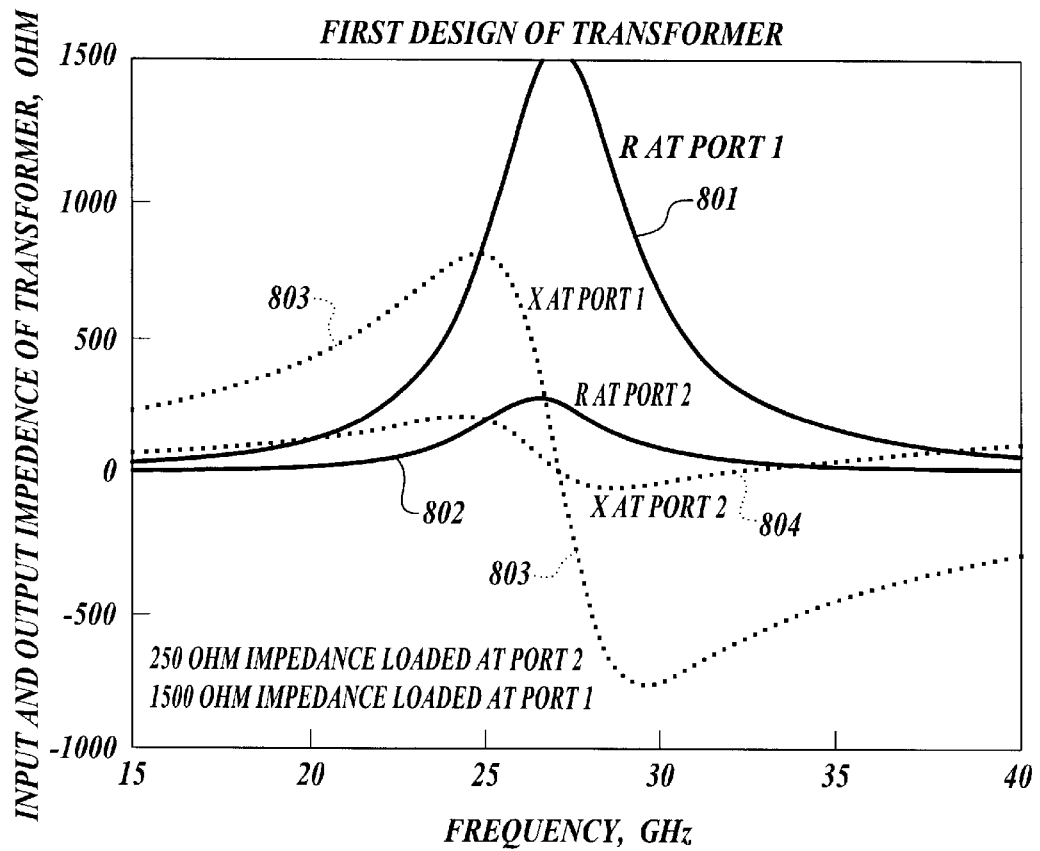

FIG. 8 illustrates a graph of the transformed impedance of a transformer in accordance with another embodiment of the present invention. The first line 801 graphs the resistance of port 1 when port 2 is loaded with an impedance of 250 Ohms. The second line 802 graphs the input impedance of port 2 when port 1 is loaded with an impedance of 1600 Ohms. The third and forth lines 803 and 804 respectively graph the input reactance, the imaginary component of the impedance, of port 1 and port 2. Similarly, FIG. 9 illustrates a graph of the real (line 901) and imaginary (line 902) components of the transformed impedance when the transformer is loaded at port 2 with a 200 Ohm impedance.

Figure 9:
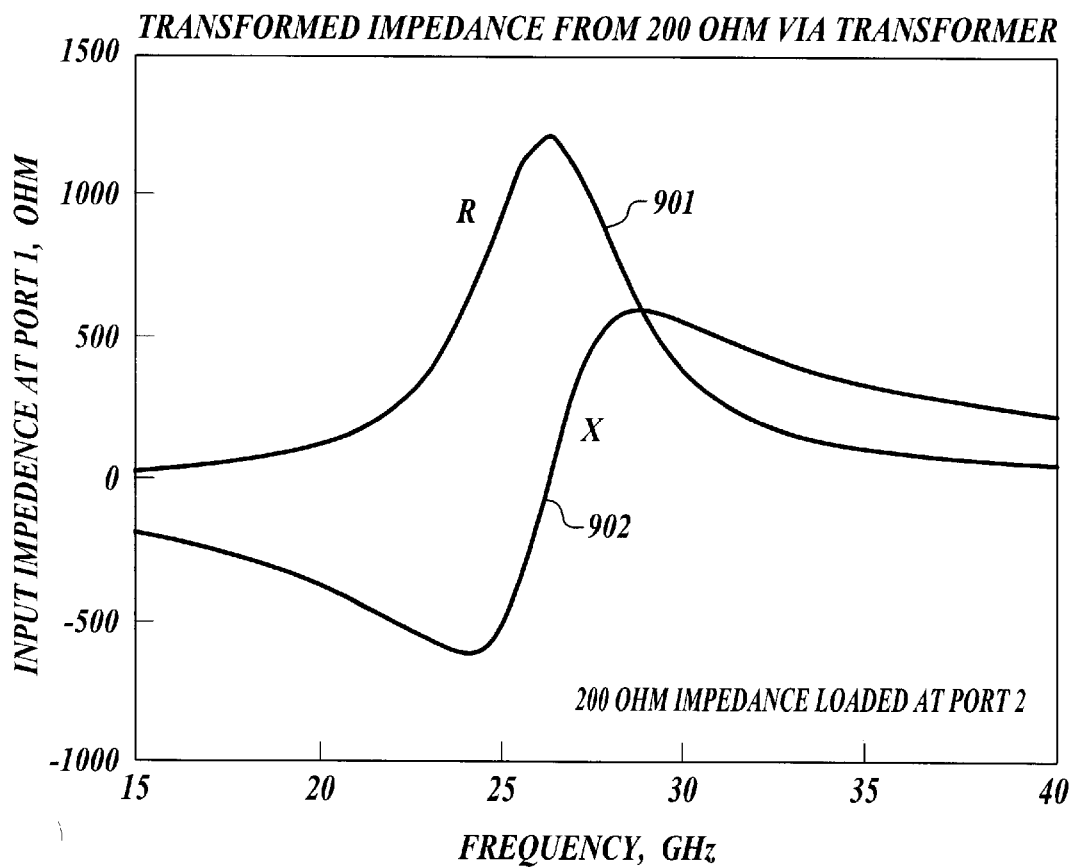

As shown by the various transformer configurations of FIGS. 5 and 9, the transformer can be configured to adapt to a wide range of impedance transfer requirements. For example, the design of the impedance transformer shown in FIGS. 1A and 2A meet the basic requirement of transformation from 200 Ohms to 1000, Ohms operating at a center frequency in the range of 20 to 40 GHz, and having a bandwidth of about 10%, and with a component size within 500 $\mu$m by 500 $\mu$m.

Although the above-described transformers 100 and 400 may be analyzed with conventional electrical models such as those illustrated in FIGS. 1B and 2B, it is also possible to utilize a more sophisticated analysis tool such as a finite-difference time-domain (FDTD) analysis algorithm. Disclosed herein, a FDTD analysis algorithm is used to model and analyze the various embodiments of the vertical transformer of the present invention. The FDTD algorithm is known to one of ordinary skill in the art and is typically used to model various RF elements, such as resistors, planar inductors, and capacitors. Details of such applications of the FDTD algorithm is described in M. Picket-May and A. Taflove, "FDTD Modeling of Digital Signal Propagation in 3-D Circuits With Passive and Active Loads," *IEEE Trans. MTT*, Vol. 42, pp. 1514–1523, August 1994, the subject matter of which is specifically incorporated herein by reference. In addition, the FDTD algorithm has been used to model more complicated MMIC elements such as via holes. A detailed description of the application of the FDTD algorithm to such MMIC elements is discussed in Dongsoo Koh, Hong-Bae Lee and Tatsuo Itoh, "A Hybrid Full-Wave Analysis of Via-Hole Grounds Using Finite-Difference and Finite-Element Time-Domain Methods," *IEEE Trans. MTT*, Vol. 45, No. 12, pp. 2217–2222, December 1997, the subject matter of which is specifically incorporated herein by reference.

Generally described, the method applies the FDTD algorithm for performing computer-aided design of complex structures, such as the above-described vertical transformer. In the application of FDTD algorithm a user defines specific parameters of the complex structure, such as the parameters of a vertical transformer. The routine then calculates the magnetic and electrical field distribution by the use of applicable Maxwell's equations and the user specified parameters. The magnetic and electrical field distributions are then treated on the boundaries of the code through an absorbing boundary conditions (ABC) subroutine. As known by those of ordinary skill in the art, the FDTD and absorbing boundary condition routines model a three-dimensional structures by dividing the three-dimensional structure into cubic cells and iteratively performing the magnetic and electrical field analysis on each cubic cell. Once all calculations are performed, the method of the present invention provides data charts of the transformed impedance and frequency response of the analyzed vertical transformer. In addition, the electric and magnetic field information is converted to circuit parameters such as voltage and current, from which, circuit characteristics such as impedance, transmission and reflection can be obtained.

Also known to those skilled in the art, the FDTD and absorbing boundary condition routines can be implemented in a software application running on a standalone or networked computing device. Generally known programming methods utilizing C, C++, Fortran, Pascal, or other commonly known programming languages can be used to implement the FDTD and absorbing boundary condition routines.

Figure 10:
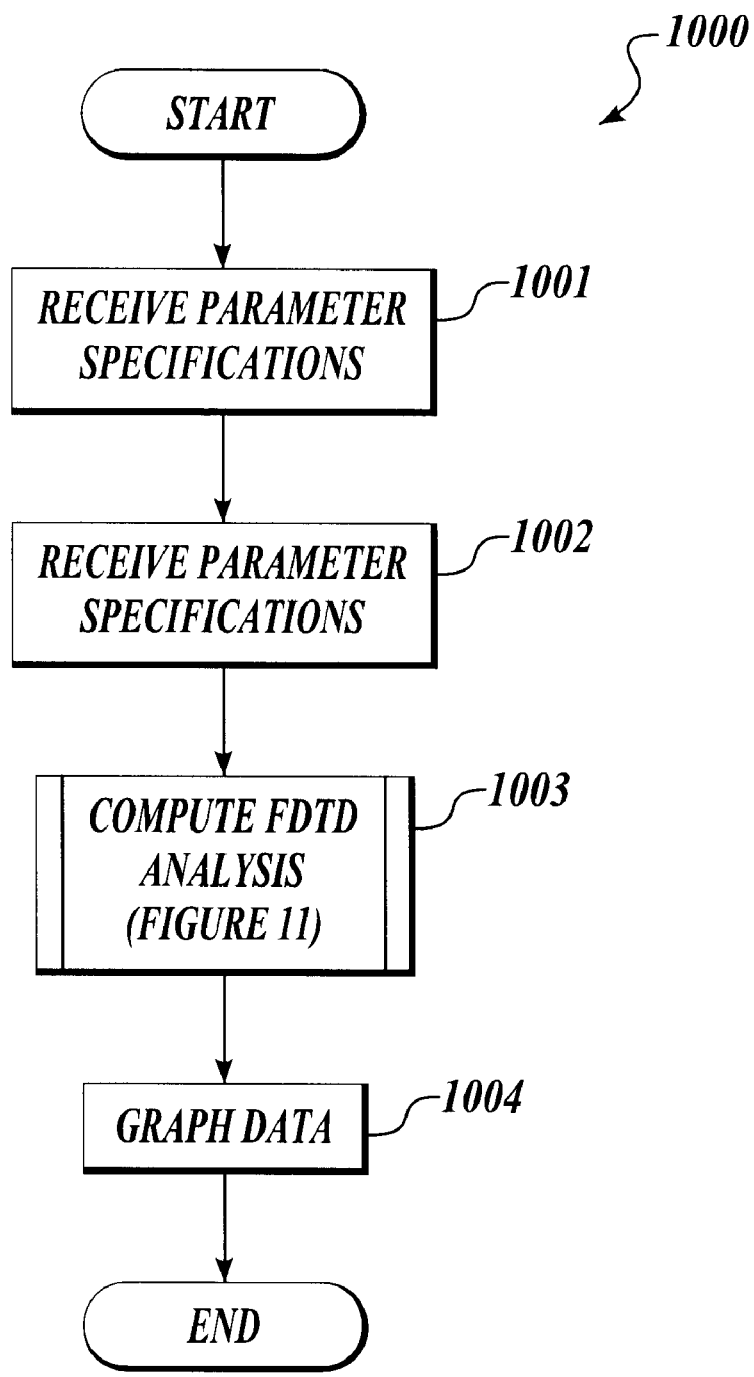
FIG. 10 illustrates a flow diagram of a modeling and analysis routine for modeling and analyzing a vertical transformer.

Referring now to FIG. 10, a general description for the FDTD routine 1000 will now be described. The process starts at block 1001 where the system running the FDTD routine 1000 receives parameter specifications. In this part of the process, the routine 1000 is configured to allow a user to enter the parameters in a computing device for the FDTD calculations. More specifically, the system is configured to receive the number of cells in the system, the space steps in the three-dimensional directions, initial values of the source specification, and the tensions of the modeled structure. The source specification defines the parameters of the input signal, such as for instance a raised-cosine function. The FDTD routine 1000 is also configured to receive the FDTD coefficients and the absorbing boundary condition coefficients. Also in block 1001, the FDTD routine 1000 is configured to receive the absorbing boundary conditions, such as a first order, second order, etc., to determine the level of accuracy of the calculations. The above-described parameters are generally known to one of ordinary skill in the art and, therefore, further explanation of these parameters is not be provided herein.

Figure 11:
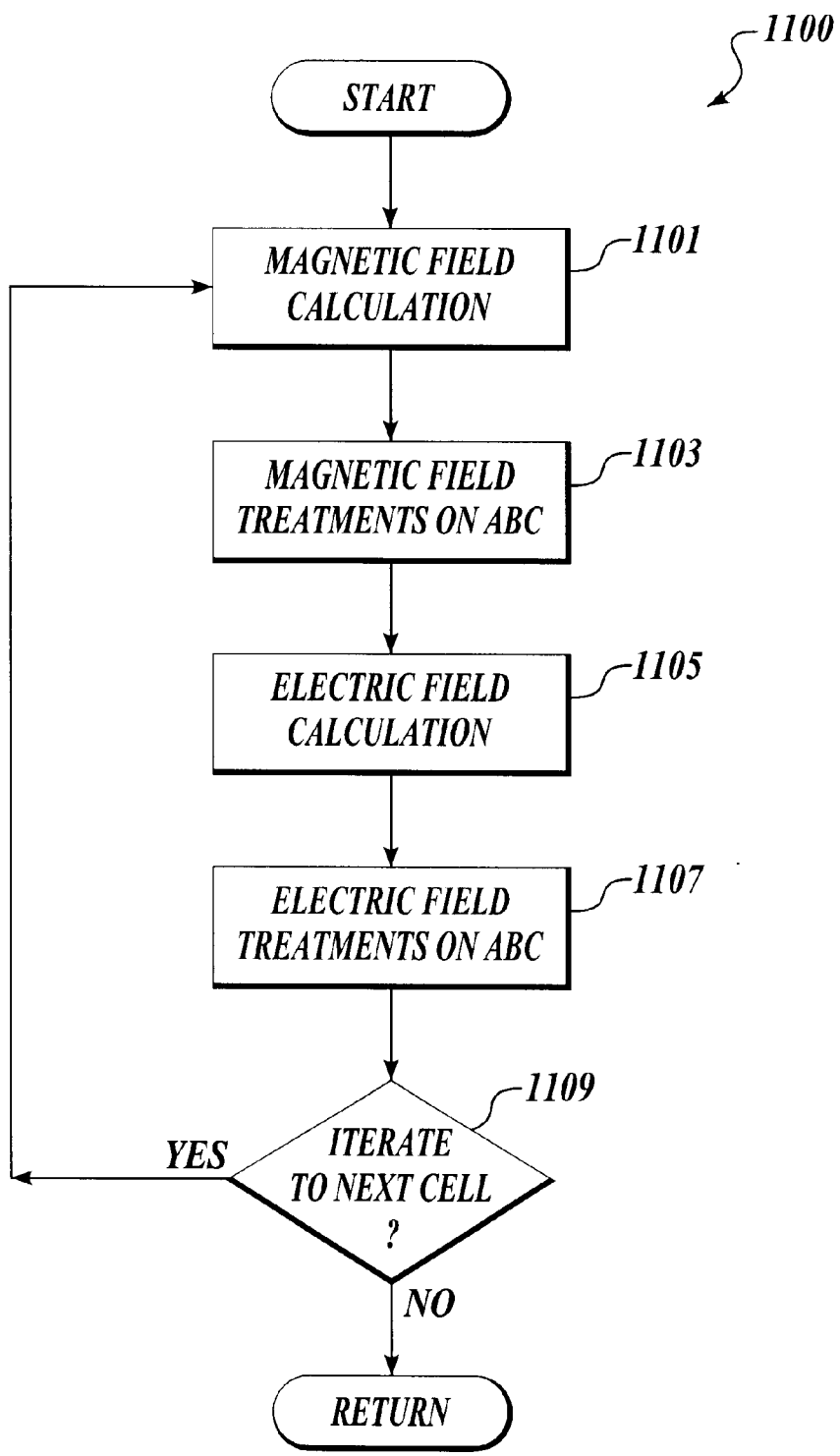
FIG. 11 illustrates a flow diagram of a FDTD calculation routine utilized in the modeling and analysis routine shown in FIG. 10.

After receiving the parameter specifications, the FDTD routine 1000 continues at block 1003, where the FDTD calculations are performed. In this part of the routine, variables may be initialized. For instance, as mentioned above, values indicating the initial electric and magnetic fields for the bottom, top, and side surfaces of the modeled transformer may be provided. In one embodiment, the absorbing boundary conditions can be initially set to a zero value. As shown in the flow diagram of FIG. 11, the routine of the FDTD calculations of block 1003 is described in more detail. The flow diagram of FIG. 11 illustrates a general overview of a FDTD calculation routine 1100.

The FDTD calculation routine 1100 starts at block 1101 where the magnetic field calculations are executed. As known to one of ordinary skill in the art, the magnetic field calculations determine the field value of an individual cell of the modeled transformer using Maxwell's models. This calculation is performed for all of the cells in the same temporal space to obtain magnetic field distribution at a given time and position. Next, at block 1103, the magnetic field treatments determined in the process of block 1101 are applied to the absorbing boundary conditions. Then at blocks 1105 and 1107, electronic field calculations are preformed on the individual cell of the modeled transformer. As shown by the loop of blocks 1101–1109, the electronic field calculation is performed for all of the cells of the model to determine the electric field distributions at a number of positions and points in time. The results of the electronic field calculation is then applied to the absorbing boundary conditions (block 1107). As shown in block 1109, the FDTD calculation routine 1100 then determines if it should proceed to the next section, e.g., a section with a specific position at a specific time, of the modeled transformer. At block 1109, if the routine determines that it should proceed, the routine then returns to block 1101 where the process of blocks 1101–1107 are repeated for another section. Alternatively, at block 1107, if the FDTD calculation routine 1100 determines that the calculation is complete, the FDTD calculation routine 1100 terminates.

Figure 12:
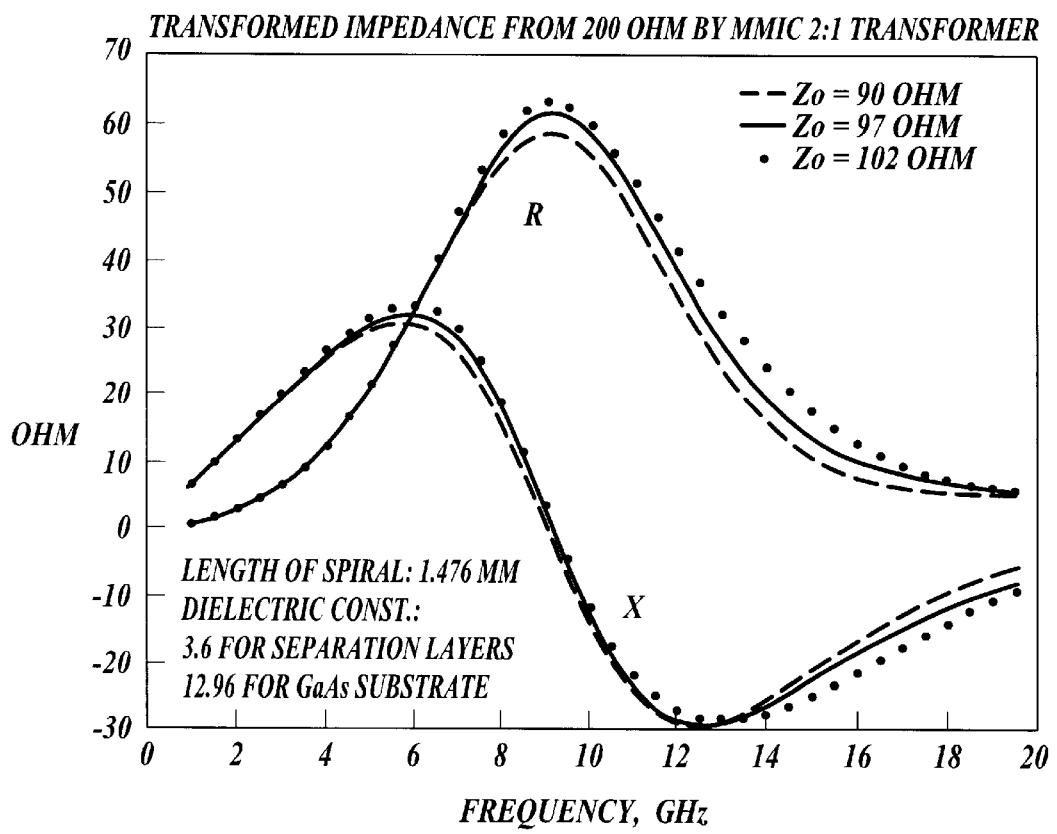
FIGS. 12–14 illustrate the results of the modeling and analysis routine shown in FIG. 10 in the form of transformed impedance and frequency response graphs.
Figure 13:
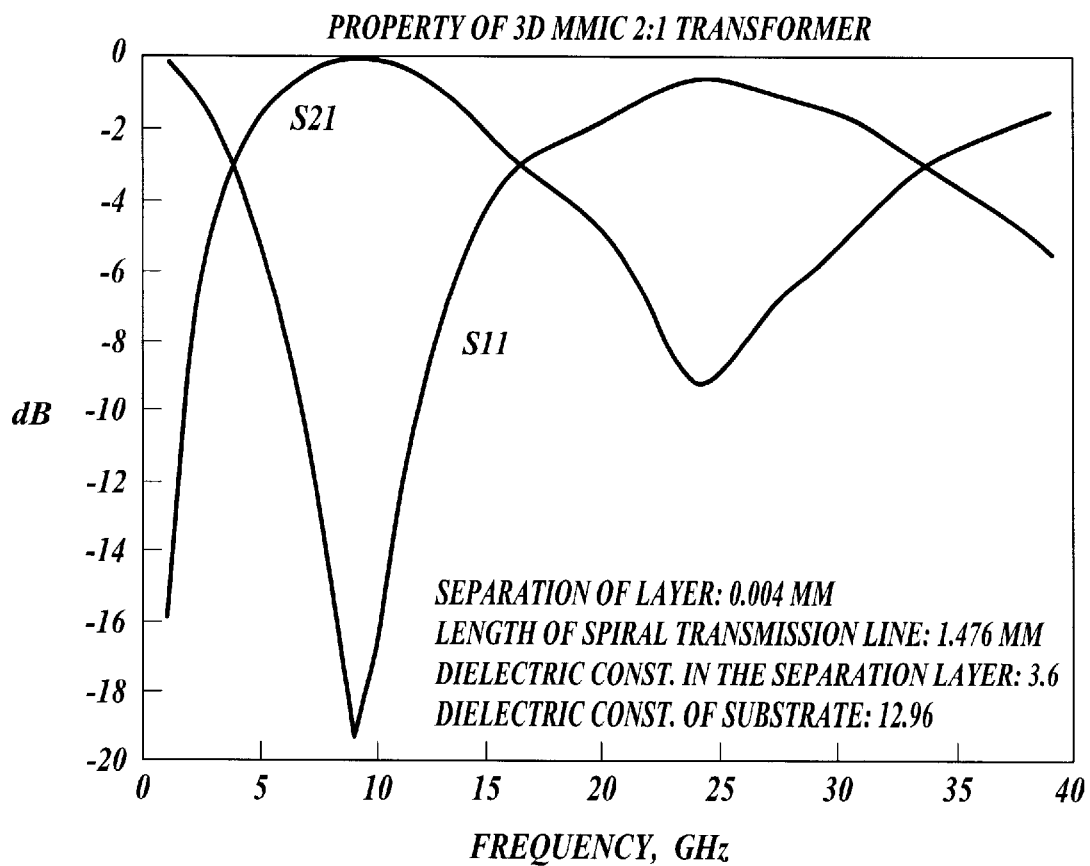
Figure 14:
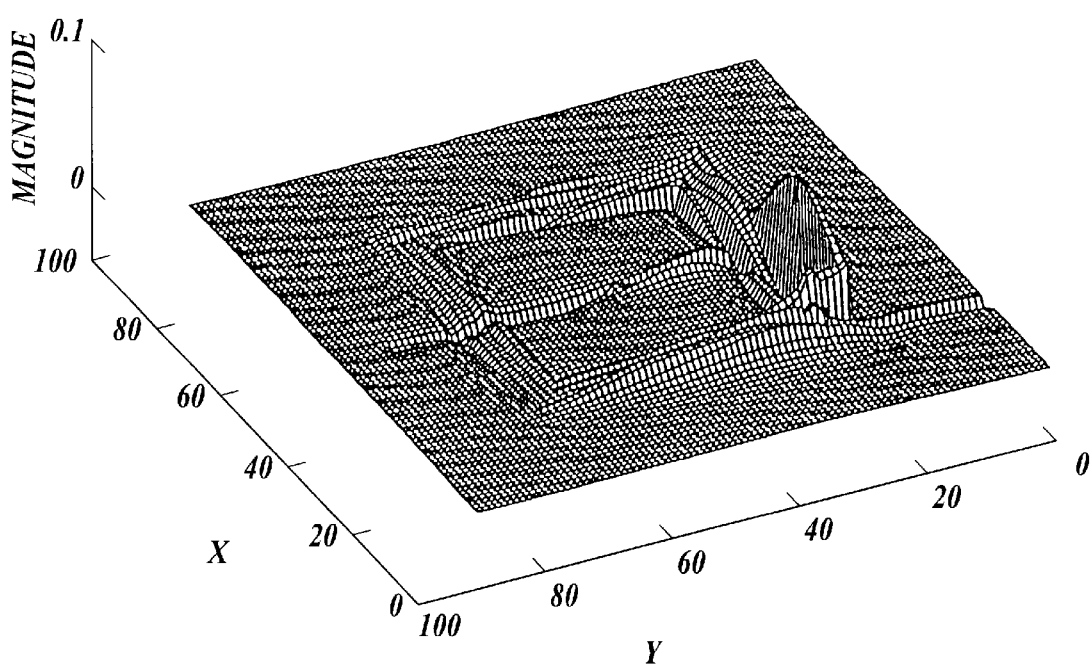

Referring again to FIG. 10, the FDTD routine 1000 continues at block 1104 where the routine then graphs the data calculated and analyzed in block 1003. Several exemplary diagrams of the FDTD routine 1000 output are illustrated in FIGS. 12–14. As shown in FIGS. 12–14, the output diagrams can be configured to draft the impedance transformation of the modeled transformer (FIG. 12), the general frequency response (transmission parameter, $S_{21}$, and reflection parameter $S_{11}$) of the modeled transformer (FIG. 13), or any other graph illustrating the calculated electric and magnetic fields of the modeled transformer (FIG. 14). Although the above example of the FDTD routine 1000 involves the modeling of a transformer, the FDTD method of the present invention can be applied to any other complex circuit structure.

The results of one exemplary analysis are shown in FIGS. 12–14. The transformer modeled and analyzed in this example of the FDTD modeling contains a primary and secondary winding having a structure similar to that of FIGS. 1A and 2A.; The analyzed transformer is made from a material having a dielectric constant of 12.96 for the GaAs substrate. The dielectric constant of the separation layers 3.6 (polyamides), strip width 4.1 μm, and gap between strips 4.1 μm. This modeled transformer, for example, if configured in a coplanar configuration, having primary and secondary windings on the same plane, would consume a total area of 13.111 μm². Conversely, if this modeled structure is configured in a vertical structure such as the embodiments illustrated in FIGS. 1A and 2A, where the primary and secondary are separated into two layers with 3.0 μm separation, the transformer would only consume a total area of approximately 4,303 μm², approximately ⅓ of the area used by the coplanar structure.

As described above, vertical MMIC transformers are disclosed and modeled by the FDTD analysis method. The modeling results show that the vertical transformer of the present invention, although it may occupy a smaller area, maintains most of the original properties of a traditional lumped transformer, i.e., impedance transformation.

While the preferred embodiment of the invention has been illustrated and described, it will be appreciated that various changes can be made therein without departing from the scope of the invention. For example, although the primary and secondary windings are illustrated as being generally square, it will be appreciated that other shapes such as round, oval or other polygon shapes (hexagonal, pentagonal, octagonal, etc.) could also be used. In addition, although the embodiments illustrated above utilize only a primary and secondary winding it would be appreciated that the structure could be continued to have more than two windings arranged in different planes in an integrated circuit.

The embodiments of the invention in which an exclusive property or privilege is claimed are defined as follows:

1. A circuit assembly, comprising:
a primary winding having a first conductive strip, wherein the primary winding is positioned in a first plane;
a secondary winding having a second conductive strip, wherein the secondary winding is positioned in a second plane, wherein the second plane is substantially parallel to the first plane;
a dielectric material positioned between the primary and secondary windings; and
a conductive material positioned and formed to provide electrical communication between an interior section of the primary winding and an interior section of the secondary winding, wherein the configuration of the primary and secondary windings and an effective distance between the primary and secondary windings produce a specific ratio of real and imaginary components of the impedance between an exterior section of the primary winding and the conductive material.

2. The circuit assembly of claim 1, wherein the conductive material is also configured to function as a common ground node between the primary and secondary winding.

3. The circuit assembly of claim 1, wherein the first and second conductive strips are substantially vertically aligned.

4. The circuit assembly of claim 1, wherein the primary and secondary windings are positioned at a distance of less than 8 microns from each other.

5. The circuit assembly of claim 1, wherein the primary and secondary windings are constructed of copper.

6. The circuit assembly of claim 1, wherein the conductive material is formed from a single via.

7. A circuit assembly, comprising:
a primary winding having a first conductive strip, wherein the primary winding is positioned in a first plane;
a secondary winding having a second conductive strip, wherein the secondary winding is positioned in a second plane, wherein the second plane is substantially parallel to the first plane;
a dielectric material positioned between the primary and secondary winding;
a first conductive material positioned to provide electrical communication between an interior section of the primary winding and a common conductor, wherein the configuration of the primary and secondary windings and an effective distance between the primary and secondary windings produce a specific ratio of real and imaginary components of the impedance between an exterior section of the primary winding and the common conductor; and
a second conductive material positioned to provide electrical communication between an exterior section of the secondary winding and the common conductor.

8. The circuit assembly of claim 7, wherein the primary and secondary windings are positioned at a distance less than 8 microns from each other.

9. The circuit assembly of claim 7, wherein the first and second conductive strips are substantially vertically aligned.

10. The circuit assembly of claim 7, wherein the primary and secondary windings are constructed of copper.

11. The circuit assembly of claim 7, wherein the first conductive material is formed from a single via.

12. The circuit assembly of claim 7, wherein the second conductive material is formed from a via.

13. A transformer for use in an integrated circuit, comprising:
a primary winding disposed in a first layer of the integrated circuit;
a secondary winding disposed in a second layer of the integrated circuit, the second layer being separated from the first layer by a dielectric layer; wherein the primary and secondary windings are positioned such that the windings are inductively coupled, wherein the configuration of the primary and secondary windings and an effective distance between the primary and secondary windings produce a specific ratio of real and imaginary components of the impedance between an exterior section of the primary winding and a conductor that is in electrical communication with an interior section of the primary winding.

14. The transformer of claim 13, wherein the primary and secondary windings are substantially vertically aligned in the integrated circuit.

15. The transformer of claim 13, further comprising one or more additional windings disposed in separate layers of the integrated circuit and positioned to be inductively coupled to the primary or secondary windings of the transformer.

* * * * *

UNITED STATES PATENT AND TRADEMARK OFFICE
CERTIFICATE OF CORRECTION

PATENT NO.   : 6,501,363 B1
DATED        : December 31, 2002
INVENTOR(S)  : R.-J. Hwu et al.

It is certified that error appears in the above-identified patent and that said Letters Patent is hereby corrected as shown below:

<u>Column 10,</u>
Lines 5 and 34, "than 8" should read -- than 8 --

Signed and Sealed this

Fifteenth Day of July, 2003

JAMES E. ROGAN
*Director of the United States Patent and Trademark Office*